(12) United States Patent
Eng et al.

(10) Patent No.: US 6,248,604 B1
(45) Date of Patent: Jun. 19, 2001

(54) METHOD FOR DESIGN AND DEVELOPMENT OF A SEMICONDUCTOR LASER DEVICE

(75) Inventors: Julie S. Eng; Joseph Michael Freund, both of Fogelsville; George John Przybylek, Douglasville; Dennis Mark Romero, Bethlehem, all of PA (US); Arthur Mike Sergent, New Providence, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/395,934

(22) Filed: Sep. 14, 1999

(51) Int. Cl.$^7$ .................................................. G02R 31/26
(52) U.S. Cl. .............................. 438/21; 324/765; 372/576
(58) Field of Search ............................... 438/21; 324/765; 372/50, 27, 46, 576, 102; 359/124; 361/782; 347/164

(56) References Cited

U.S. PATENT DOCUMENTS

| | | | |
|---|---|---|---|
| 5,498,973 | * | 3/1996 | Cavaliere ............................... 324/765 |
| 5,561,682 | * | 10/1996 | Aoki ....................................... 372/50 |
| 5,629,838 | * | 5/1997 | Knight .................................... 361/782 |
| 5,638,103 | * | 6/1997 | Obata ..................................... 347/164 |
| 5,721,797 | | 2/1998 | Basavanhally et al. . |
| 5,732,102 | | 3/1998 | Bouadma . |
| 5,757,828 | * | 5/1998 | Ouchi ..................................... 372/27 |
| 5,784,183 | * | 7/1998 | Aoki ..................................... 359/124 |
| 5,932,139 | * | 8/1999 | Oshima ................................. 372/46 |
| 6,104,738 | * | 10/2000 | Kitoh ................................... 372/576 |
| 6,115,403 | * | 9/2000 | Brenner ............................... 372/102 |
| 6,128,258 | * | 10/2000 | Kimura ................................. 369/44 |
| 6,128,262 | * | 10/2000 | DeCusatis ............................. 369/54 |
| 6,128,267 | * | 10/2000 | DeCusatis ....................... 369/124.05 |

* cited by examiner

Primary Examiner—John F. Niebling
Assistant Examiner—Andre' C Stevenson
(74) Attorney, Agent, or Firm—Dickstein Shapiro Morin & Oshinsky LLP (57) ABSTRACT

A method for testing semiconductor laser devices is described. The method includes testing a monolithically integrated semiconductor laser device via electrical contact testing and/or far field testing. These tests will provide the total performance of the entire device. Further, the method includes accurate cleaving off of a portion of the laser device and re-testing to determine the relative performance of the remainder of the device. Through comparison of the test and re-test results, it is possible to reduce the design cycle for monolithically integrated semiconductor laser devices by detecting design flaws and imperfections or by ascertaining a more advantageous design.

32 Claims, 7 Drawing Sheets

METHOD FOR DESIGN AND DEVELOPMENT OF A SEMICONDUCTOR LASER DEVICE

FIELD OF THE INVENTION

The present invention relates to a method for use in designing and developing a semiconductor laser device. More particularly, the present invention relates to a method of testing an overall laser device, then cleaving and testing subparts thereof to obtain information which can be used in the design and development process for the laser device.

BACKGROUND OF THE INVENTION

The performance requirements of semiconductor laser devices have increased over the last few years. As the requirements continue to increase, monolithically integrated devices are increasingly being used. The increased use of monolithically integrated devices require more complex methodologies for examining their performances and for improving the efficiency of the design cycles for such devices.

Conventionally, for a complex device—for example, a monolithic integration of two devices which operate together—difficulty arises in attempting to measure the output performance parameters of the overall device. Uncertainty exists, using conventional methodology, as to which of the two devices are affecting the performance of the overall device. For example, in a monolithically integrated device combining a laser and an expander, if the light outputted from the expander is less than expected, it is difficult to determine if the problem is due to the laser or the expander. For example, in such a device, optical light is expected to be absorbed in the expander. Computer models for predicting the amount of light that should be absorbed are not accurate. Further, for a monolithically integrated device having an expander shaped to allow the beam of light to expand, conventional measuring techniques are incapable of discerning how the beam is transformed as it moves through the device.

It is possible to include a less complex device, such as non-integrated devices including only a laser, to compare to the integrated device performance A deficiency with the present state of the art using a less complex semiconductor laser device as a test device for a more complex integrated device is that unintentional flaws between the device and the test device, such as, for example, bonding damage or process variation across a wafer, are indistinguishable from flaws in the device design. This deficiency is likely to increase with increasing complexity of semiconductor laser devices. Due to the inability to distinguish between flaws in the device design and unintentional process differences between the complex device and the simplified test device, it is difficult to ascribe performance imperfections to the design of the device or in subparts thereof. This lengthens the design cycle time. In addition, it may not be known at the time of device mask design what the optimal test device layout is.

It is therefore necessary to have a design tool and methodology which is capable of accurately measuring the performance parameters of complex devices, thus shortening design cycle time and cutting design costs. Further, it is necessary to have a design tool and methodology which obviates the need for a separate testing device.

SUMMARY OF THE INVENTION

The present invention provides a method for determining performance characteristics of subcomponents of a monolithically integrated semiconductor laser device. The method includes testing performance characteristics of an entire semiconductor laser device, accurately cleaving off a portion or subpart of the laser device, re-testing a subpart of the laser device, and comparing results of the test and re-test to determine performance characteristics of the remainder subparts of the laser device relative to the performance characteristics of the entire semiconductor laser device.

The present invention also provides a method of reducing design cycle time for semiconductor laser devices. The method includes testing performance characteristics of a semiconductor laser device, accurately cleaving off a portion of the laser device, re-testing a remainder of the laser device, comparing results of the test and re-test to determine performance characteristics of the remainder of the laser device relative to performance characteristics of the laser device, and ascertaining from the comparison whether the design of the laser device can be improved.

These and other features and advantages of the invention will be more clearly understood from the following detailed description of the invention which is provided in connection with the accompanying drawings.

DETAILED DESCRIPTION OF PREFERRED EMBODIMENTS

The present invention utilizes destructive testing of a laser device to obtain information on the performance characteristics of various subparts of the laser device. The testing utilizes accurate cleaving technology to separate and test subparts of the device.

Figure 1:
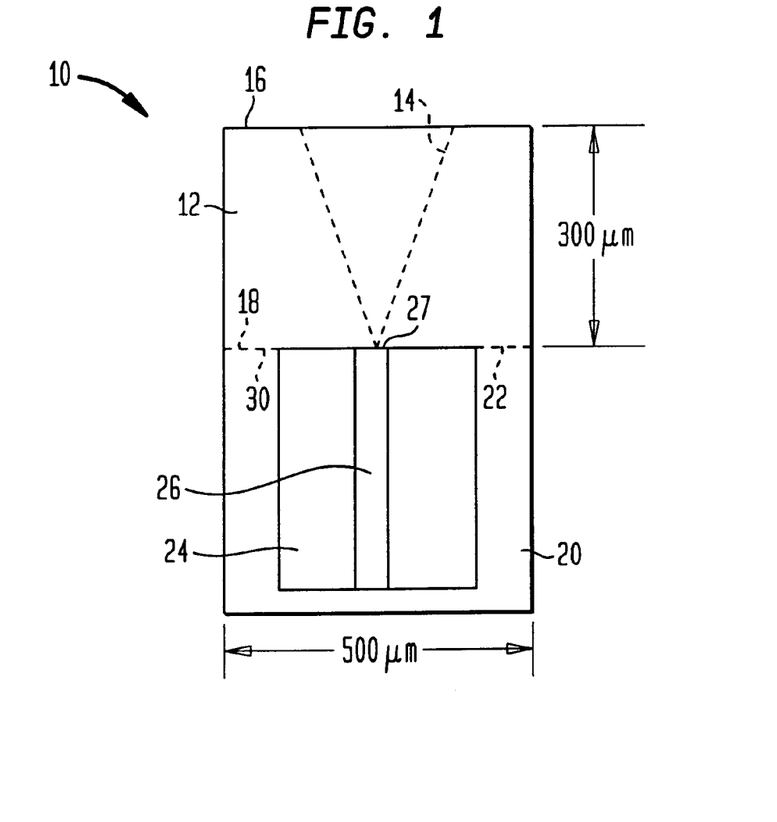
FIG. 1 is a top view of an expanded beam laser constructed in accordance with an embodiment of the present invention.
Figure 2:
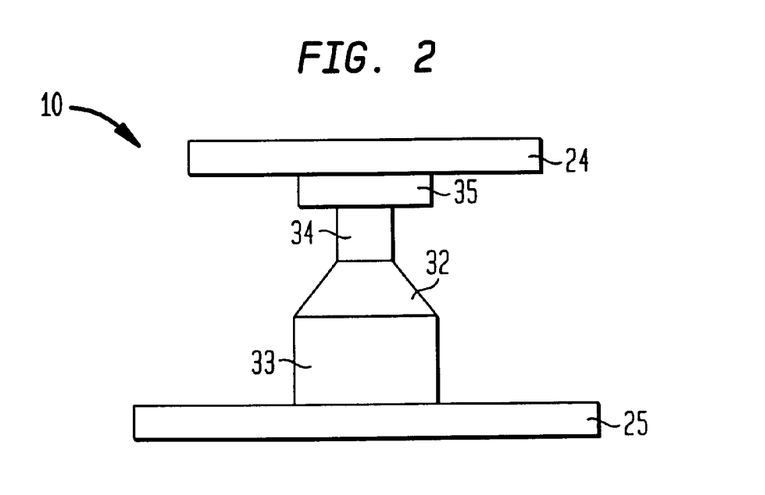
FIG. 2 is a back view of the laser of FIG. 1.
Figure 3:
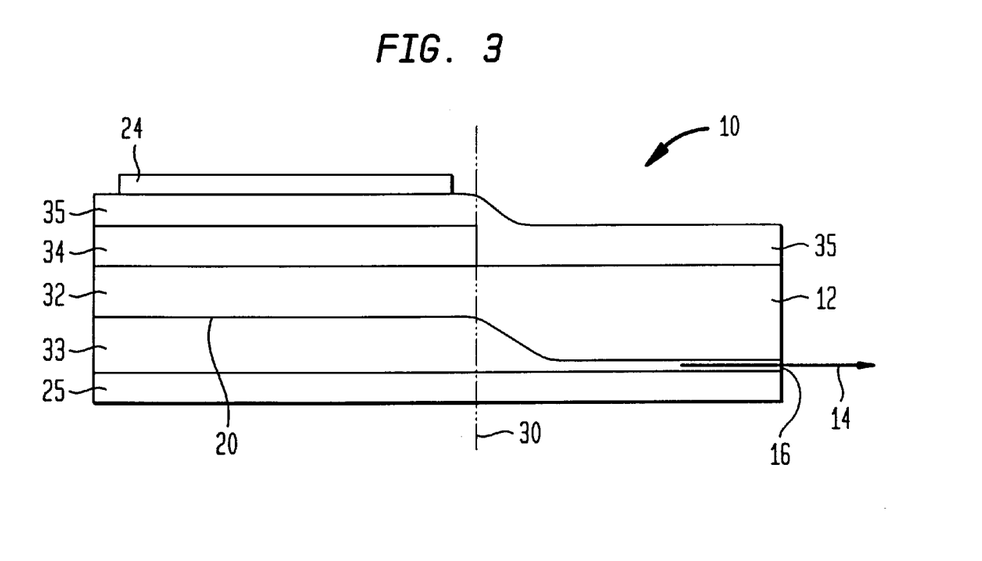
FIG. 3 is a side view of the laser of FIG. 1.

With reference to FIGS. 1–3, where like numerals designate like elements, there is shown an expanded beam laser 10 having an expander region 12 and a laser region 20. Expanded beam lasers 10 alleviate the mismatch in optical mode dimensions between a semiconductor laser and an optical fiber to which the laser 10 is coupled. Expanded beam lasers 10 further find application in conjunction with planar waveguide devices, which also suffer from the optical mode mismatch problem.

The expander region 12 includes an outlet facet 16 through which laser light 14, which is expanded in the expander region 12, exits the device 10.

The laser region 20 includes a metallization pad 24 which overlays a laser stripe 26. The laser stripe 26 is defined by mesa etching of the laser active region 34. A waveguide 33 is positioned between a spacer layer 32 and a substrate 25. The laser light 14 which is expanded within the expander region 12 is propagated along the waveguide 33 and exits the device 10 at the facet 16.

The active region 34 is the lasing region of the device. In the laser section 20, the laser mode is located in the active region 34, which is covered by a cladding region 35. As the mode propagates into the expander region 12, a large portion of the energy of the mode transfers to the underlying waveguide 33, where the mode is expanded before exiting the device at the facet 16.

As illustrated, the expanded beam laser 10 is approximately 500 micrometers ($\mu$m) in width, and 600 $\mu$m in length. As a means for reducing the design cycle time of expanded beam lasers 10, the present invention includes cleaving the expander region 12 from the laser region 20. Such a cleaving would create a cleave line 30, as well as a cleave surface 18 on the expander region 12 and a cleave surface 22 on the laser region 20. As illustrated in FIG. 1, the cleave line 30 is approximately 300 $\mu$m from the outlet surface 16, roughly the length of the expander region 12.

The cleave line 30 is cleaved accurately. Specifically, the cleave line 30 is cleaved along a line within a tolerance of plus or minus 2 microns from that line. One known cleaving apparatus which may be used to accurately cleave the cleave line 30 is the Dynatex III.

Figure 4:
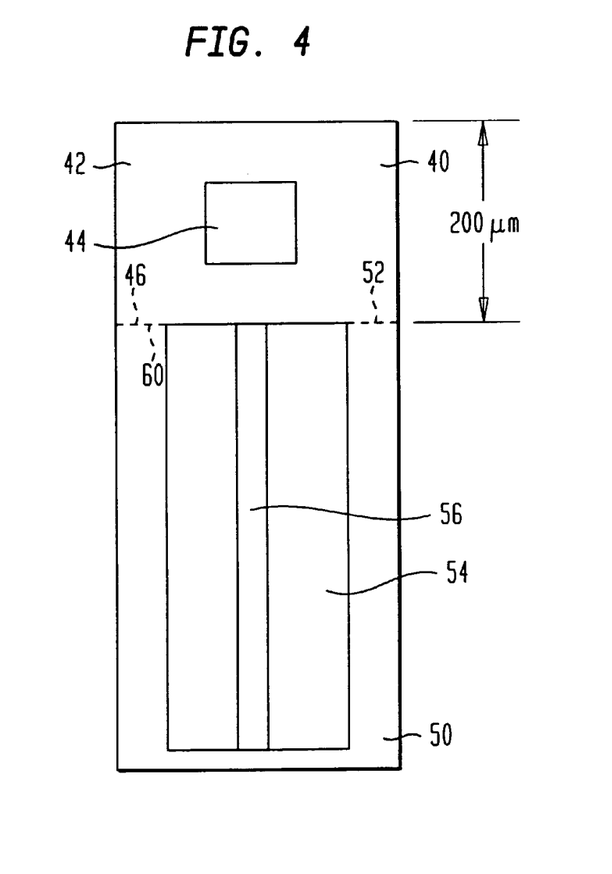
FIG. 4 is a top view of an electro-modulated laser constructed in accordance with an embodiment of the present invention.

With reference to FIG. 4, next will be described an electro-modulated laser device 40 which is shown therein. The electro-modulated laser device 40 includes a modulated region 42 and a laser region 50. The modulated region 42 includes a metallized pad 44. The laser region 50 includes a metallization pad 54 which overlays a laser stripe 56.

The modulated region 42 is, as shown, approximately 200 $\mu$m in length. In order to test the respective performances of the modulator region 42 and the laser region 50 as compared to the total performance of the electro-modulated laser device 40, the modulator region 42 is cleaved from the laser region 50 along a cleaved line 60. This creates a cleaved surface 46 on the modulator region 42 and an opposing cleaved surface 52 on the laser region 50.

A distributed Bragg reflector (DBR) laser, such as a DBR laser 70 illustrated in FIG. 5 and described in detail below, is a monolithic laser structure which has, at the end of a semiconductive laser medium (active section), a passive optical waveguide in which a grating is formed that constitutes a Bragg reflector (Bragg section). The passive optical waveguide may have a portion, that does not include any grating, interposed between the amplifying medium and the reflector grating, thereby defining a phase control section in the DBR structure. This section makes it possible to avoid any mode jumping while tuning the DBR section.

Figure 5:
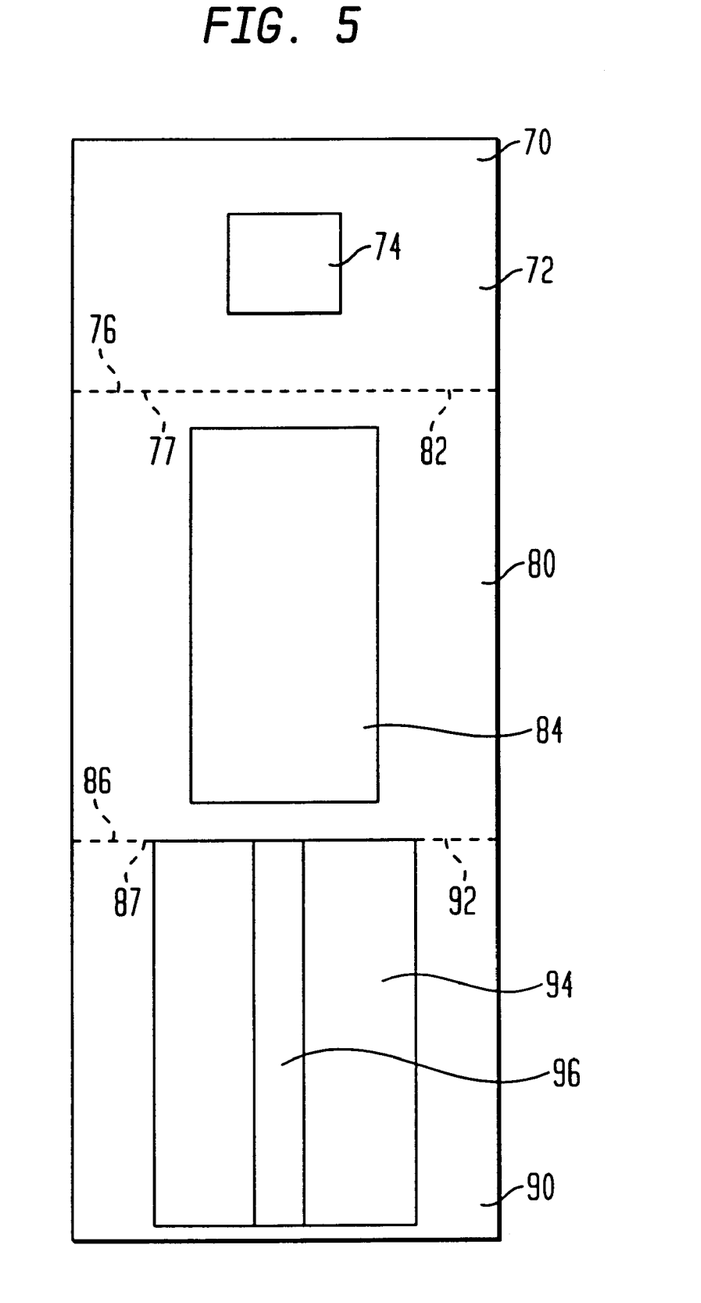
FIG. 5 is a top view of a distributed Bragg reflector constructed in accordance with an embodiment of the present invention.

With reference to FIG. 5, the distributed Bragg reflector laser 70 includes a modulator region 72, a reflector region 80, and a laser region 90. The modulator region 72 includes a metallization pad 74. The reflector region 80 includes a metallization pad 84. The laser region 90 includes a metallization pad 94 which overlays a laser stripe 96. The distributed Bragg reflector laser 70 may be cleaved in several places to determine the relative performances of each of the regions 72, 80, 90. Specifically, the modulator region 72 may be cleaved from the reflector region 80 at a cleave line 77. This creates a cleave surface 76 on the modulator region 72 and an opposing cleave surface 82 on the reflector region 80. Further, the reflector region 80 may be cleaved from the laser region 90 at a cleave line 87. This creates a cleave surface 86 on the reflector region 80 and an opposing cleave surface 92 on the laser region 90.

Figure 6:
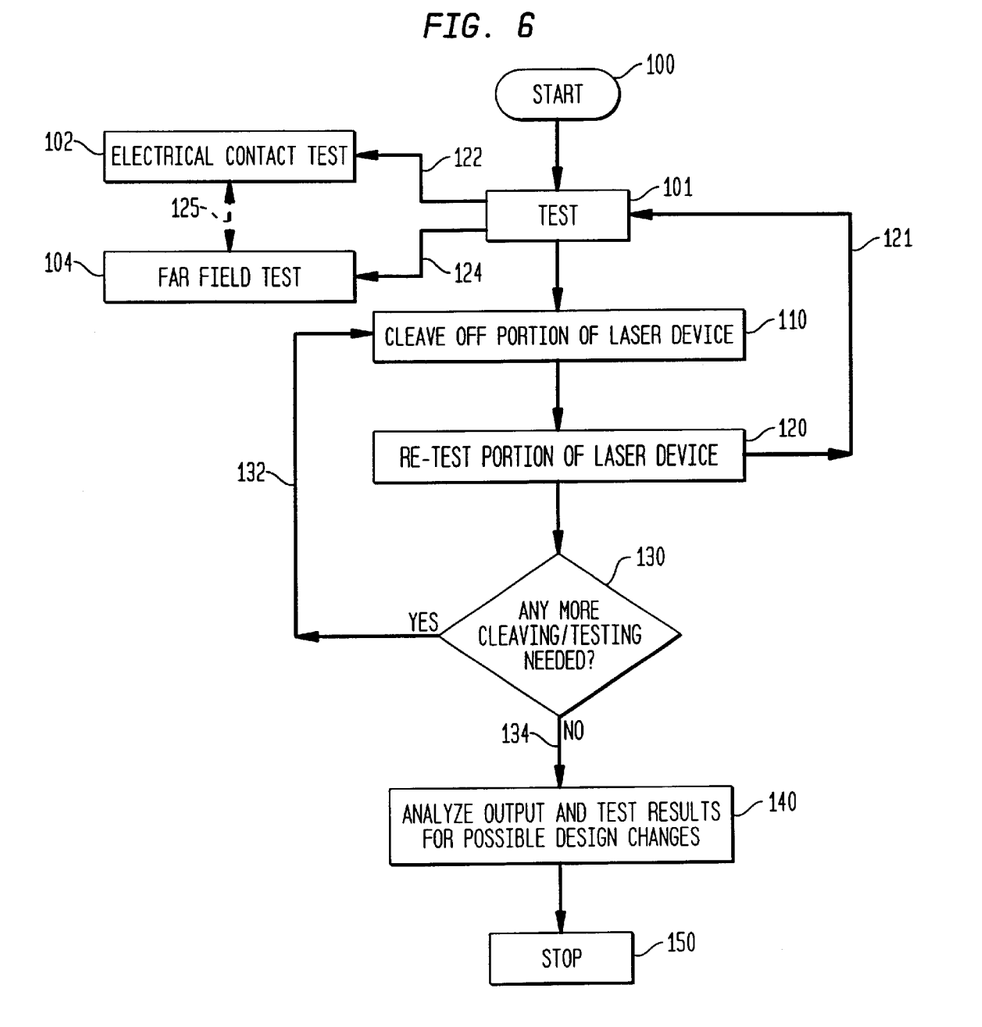
FIG. 6 is a flow diagram of the process for using accurate cleaving as a design tool in accordance with an embodiment of the present invention.
Figure 7:
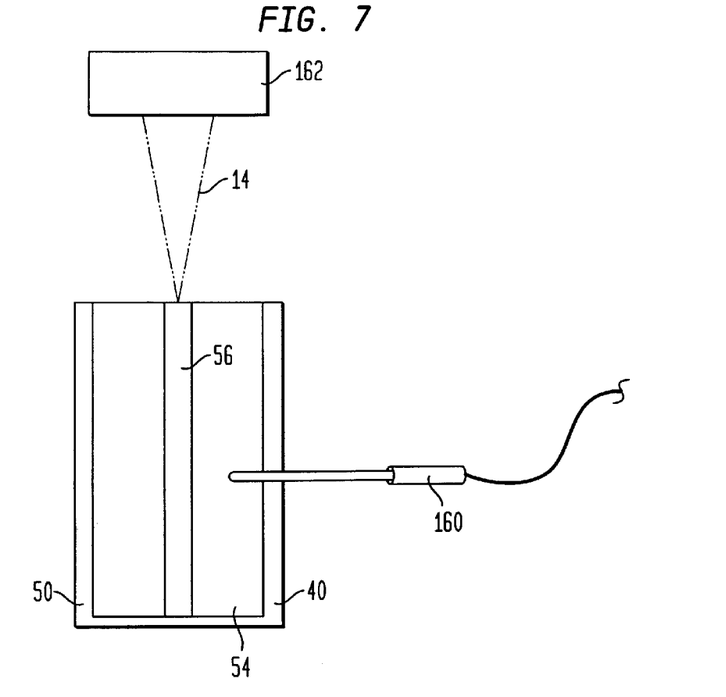
FIG. 7 is a schematic view of an electrical contact test of the laser of FIG. 4.
Figure 8:
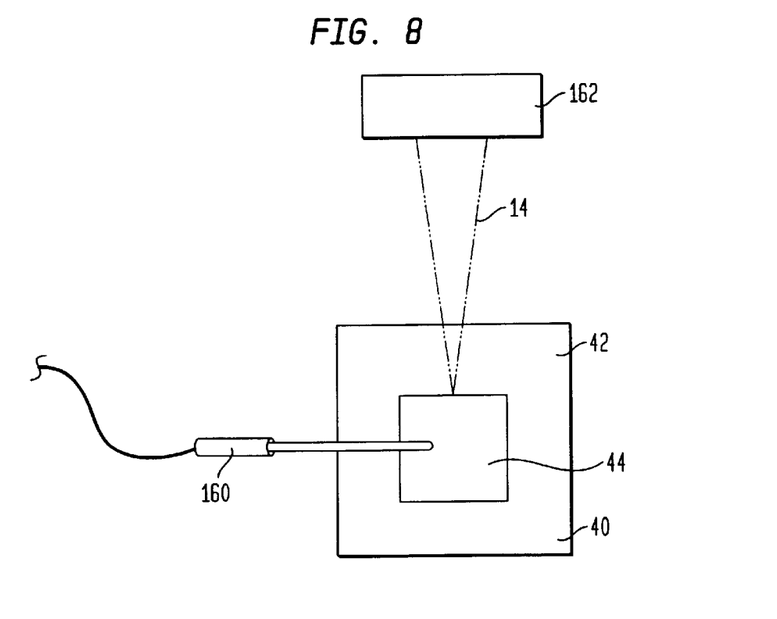
FIG. 8 is a schematic view of another electrical contact test of a portion of the laser of FIG. 4.

Next will be described the method for utilizing accurate cleaving as a design tool. The theory underlined in the below-described methodology is that to properly understand the complete performance of an integrated laser device it is necessary to ascertain the total performance of the device and then accurately cleave the device to ascertain each of the cleaved portions' relative performances. Thus, with reference to FIG. 6, the method is started at step 100. At step 101, the entire device 10, 40, or 70 is tested. As illustrated in FIGS. 7–10, the device 40 is tested. The device 40 may be tested in one of two illustrated ways. The first test, taking pathway 122 to step 102, is an electrical contact test of the laser device 40. In the electrical contact test, an electrical probe 160 contacts the metallization pad 54 within the laser region 50 (FIG. 7). Next, the laser light exiting the area 14 is optically coupled to an industry standard power meter 162 to obtain an LI curve (power output/current in). From the LI curve, slope efficiency and threshold current can be determined.

Figure 9:
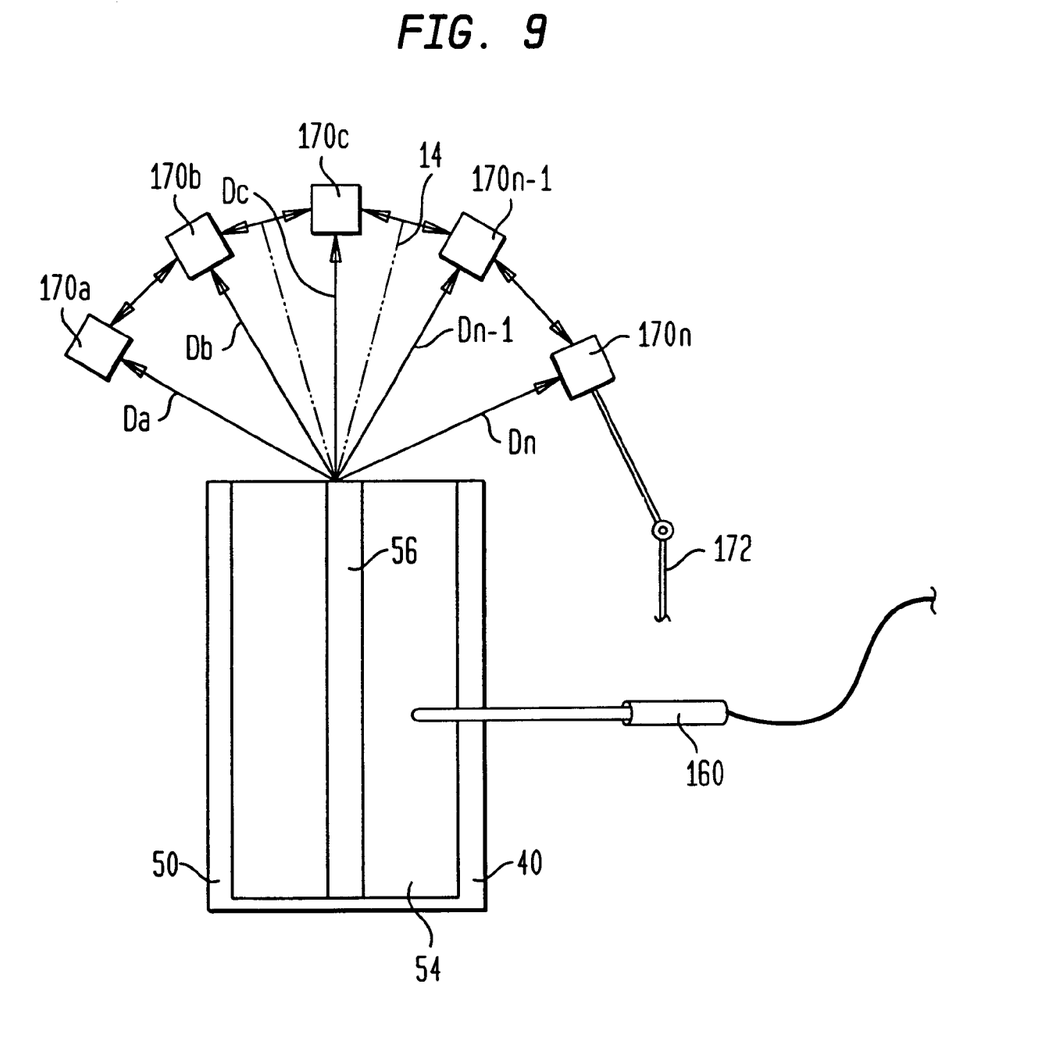
FIG. 9 is a schematic view of a far field test of the laser of FIG. 4.
Figure 10:
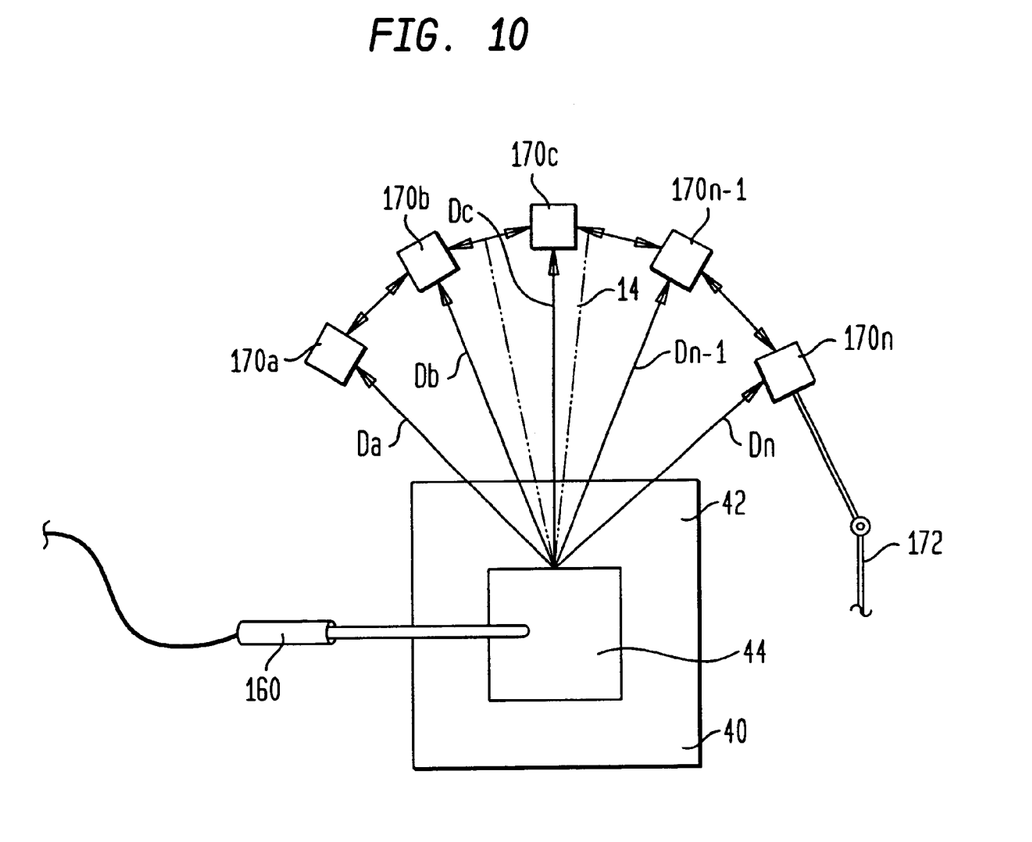
FIG. 10 is a schematic view of another far field test of a portion of the laser of FIG. 4.

The second type of test of the laser device 40, taking pathway 124 from step 101 to step 104, is a far field test. In the far field test, an electrical probe 160 is attached to the metallization pad 24 of the laser device 10 (FIG. 9). A movable photo-detector 170 is moved along an arc as illustrated in positions $170_a$–$170_n$ which are spaced apart on a swing arm 172 in front of the output surface 46. The expansion of the laser light exiting the area 14 is determined over a specified distance $D_a$–$D_n$ (the distance between the output surface 46 and the photo-detector 170) to ascertain the laser beam divergence, or far field parameters. By ascertaining the laser light intensity at each of the positions the photo-detectors $170_a$–$170_n$, a laser far field pattern may be mapped out.

It is to be understood that the laser device 10, 40 or 70 may be tested at step 102 and then take pathway 125 to be tested at step 104, or tested at step 104 and then take pathway 125 to be tested at step 102, or may be tested at either step 102 or step 104.

Once the laser device as a whole has been tested, a portion of the laser device is cleaved off at step 110, such as the expander region 12. Although the cleaved off portion, shown in FIGS. 1 and 3, is approximately 200–300 $\mu$m in length, with current technology the amount cleaved off may be as small as 50 $\mu$m in length.

Once a portion of the laser device 40 has been cleaved off at step 110, the laser device is re-tested at step 120. Thus, for example, if the modulated region 42 of the electro-modulated laser device 40 is cleaved off at cleave line 46, the laser region 50 is re-tested at step 120 (FIG. 8) by taking route 121 back to step 101 and subjecting the laser region 50 to the same testing, at step 102 and/or step 104, to which the whole laser device 40 was previously subjected. Thus, if the whole laser device 40 was subjected to the far field test at step 104, the laser region 50 is re-tested by taking branch 124 to step 104. Likewise, if the whole laser device 40 was also tested at step 102, branch 125 is taken and the laser region 50 is tested at step 102.

Comparing measurements of device threshold current and slope efficiency before and after cleaving will indicate any optical loss from the cleaved off portion, here the expander region 12. Analysis of the far field pattern before and after cleaving can demonstrate the evolution of the expanded beam laser device 10 mode shape from the laser region 20 to the expander region 12, which helps in ascertaining unwanted structure within the laser device 10. By making such a comparison, it is possible to more quickly redesign the laser device 10 or to ascertain a difference in the performance characteristics of the various subparts of the laser device 10 (or lasers 40, 70) and where there are imperfections or flaws within the laser device 10 which can be designed out. Further, through this process the relative performances of each of the portions making up the laser device 10 is ascertained. Additionally, since a separate test device is not used, all of the performance characteristics determined in the tests come from the laser device 10 itself or its subparts.

Furthermore, by taking repeated electrical contact test measurements (step 102) of cleaved sections, it is possible to determine the amount of light absorbed, or lost, per micron of the device. Such experimental determination of the loss/micron of light is more accurate than conventional modeling techniques.

After re-testing the laser device at step 120, a decision is made at step 130 whether another portion is to be cleaved from the laser device 40. If, for example, the electro-modulated beam laser device 40 is cleaved, and the cleaved portion is not the entire laser region 50, route 132 can be taken and the laser device 40 can be re-cleaved at step 110 and then re-tested at step 120 to ascertain that cleaved portion's, or the remainder of the laser device's 40, relative performance.

Further, if expanded beam laser 10 is cleaved at step 110, and the cleaved portion is not the entire expander region 12, branch 132 can be taken and the laser device 10 can be re-cleaved at step 110 and then re-tested at step 120. The same is true for the distributed Bragg reflector laser 70 if less than all of the modulator region 72 was initially cleaved. Further, if the distributed Bragg reflector laser 70 was initially cleaved along cleave line 77, it can be cleaved again along the cleave line 87 at step 110. If no further cleaving or testing is determined necessary at step 130, branch 134 is taken and a computer (not shown) records the various measurements and performs an analysis at step 140 for any possible design changes. The method is stopped at step 150.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while the electrical contact test at step 102 has been described in terms of contacting a probe to the metallization pads 44, 54, obviously the metallization pads 24, 74, 84 and 94 may be contacted and/or other tests performed. Accordingly, the invention is not to be seen as limited by the foregoing description, but is only limited by the scope of the appended claims.

What is claimed as new and desired to be protected by Letters Patent of the United States is:

What is claimed is:

1. A method for determining performance characteristics of subparts of a monolithically integrated semiconductor laser device, comprising:

testing performance characteristics of an entire semiconductor laser device;

accurately cleaving off a portion of the laser device;

re-testing a remainder portion of the laser device; and using results of the test and the re-test to evaluate performance characteristics of at least a portion of the entire semiconductor laser device.

2. The method of claim 1, wherein said using step comprises using the results of the test and the re-test to determine performance characteristics of the remainder portion of the laser device relative to the performance characteristics of the entire semiconductor laser device.

3. The method of claim 1, further comprising ascertaining performance characteristics of the cleaved off portion relative to the performance characteristics of the entire semiconductor laser device.

4. The method of claim 3, wherein said ascertaining performance characteristics of the cleaved off portion comprise testing the cleaved off portion.

5. The method of claim 3, wherein said ascertaining performance characteristics of the cleaved off portion comprises comparing the performance characteristics of the remainder portion of the laser device relative to the performance characteristics of the entire semiconductor laser device to determine a differential performance characteristic value, said value being attributable to said performance characteristics of the cleaved off portion.

6. The method of claim 1, wherein said testing comprises:

contacting a conductive portion of the laser device with an electrical probe;

optically coupling Laser light emanating from the laser device to a power meter; and obtaining a value of power output relative to current input.

7. The method of claim 6, wherein said re-testing comprises:

contacting a conductive portion of the remainder of the laser device;

optically coupling laser light emanating from the remainder of the laser device; and obtaining a value of power being output relative to current being input.

8. The method of claim 7, wherein said comparing results of the test and re-test comprises comparing the values obtained in the test and re-test.

9. The method of claim 1, wherein said testing comprises:

contacting a conductive portion of the laser device;

moving a photo-detector in an arc in front of the laser device;

measuring an expansion of laser light emanating from the laser device over a specified distance; and determining a far field pattern for the laser device.

10. The method of claim 9, wherein said re-testing comprises:

contacting a conductive portion of the remainder of the laser device;

moving a photo-detector in an arc in front of the remainder of the laser device;

measuring an expansion of laser light emanating from the remainder of the laser device over a specified distance; and determining a far field pattern from the remainder of the laser device.

11. The method of claim 10, wherein said comparing results of the test and re-test comprises comparing the far field patterns determined in the test and re-test.

12. The method of claim 1, wherein said accurate cleaving comprises cleaving the laser device along a predetermined cleave line within a tolerance of about two microns.

13. The method of claim 1, wherein the portion of the laser device cleaved off is between about 50 μm and 300 μm in length.

14. The method of claim 1, wherein the laser device is an expanded beam laser.

15. The method of claim 1, wherein the laser device is an electro-modulated laser.

16. The method of claim 1, wherein the laser-device is a distributed Bragg reflector laser.

17. A method of reducing design cycle time for semiconductor laser devices, comprising:
   testing performance characteristics of a semiconductor laser device;
   accurately cleaving off a portion of the laser device;
   re-testing a remainder portion of the laser device;
   using results of the test and the re-test to evaluate performance characteristics of at least a portion of the laser device; and
   altering the design of the laser device based upon the results of the test and the re-test.

18. The method of claim 17, wherein said using step comprises using the results of the test and the re-test to determine performance characteristics of the remainder portion of the laser device relative to performance characteristics of the laser device.

19. The method of claim 17, further comprising ascertaining performance characteristics of the cleaved off portion relative to the performance characteristics of the entire semiconductor laser device.

20. The method of claim 19, wherein said step of ascertaining performance characteristics of the cleaved off portion comprise testing the cleaved off portion.

21. The method of claim 19, wherein said step of ascertaining performance characteristics of the cleaved off portion comprises comparing the performance characteristics of the remainder of the laser device relative to the performance characteristics of the entire semiconductor laser device to determine a differential performance characteristic value, said value being attributable to said performance characteristics of the cleaved off portion.

22. The method of claim 17, wherein said testing comprises:
   contacting a conductive portion of the laser device with an electrical probe;
   optically coupling laser light emanating from the laser device to a power meter; and
   obtaining a value of power output relative to current input.

23. The method of claim 22, wherein said re-testing comprises:
   contacting a conductive portion of the remainder of the laser device;
   optically coupling laser light emanating from the remainder of the laser device; and
   obtaining a value of power being output relative to current being input.

24. The method of claim 23, wherein said comparing results of the test and re-test comprises comparing the values obtained in the test and re-test.

25. The method of claim 17, wherein said testing comprises:
   contacting a conductive portion of the laser device;
   moving a photo-detector in an arc in front of the laser device;
   measuring an expansion of laser light emanating from the laser device over a specified distance; and
   determining a far field pattern for the laser device.

26. The method of claim 25, wherein said re-testing comprises:
   contacting a conductive portion of the remainder of the laser device;
   arraying a plurality of photo-detectors spaced apart in front of the remainder of the laser device;
   measuring with said photo-detector an expansion of laser light emanating from the remainder of the laser device over a specified distance; and
   determining a far field pattern from the remainder of the laser device from the measured expansion of laser light.

27. The method of claim 26, wherein said comparing results of the test and re-test comprises comparing the far field patterns determined in the test and re-test.

28. The method of claim 17, wherein said accurate cleaving comprises cleaving the laser device along a predetermined cleave line within a tolerance of about two microns.

29. The method of claim 17, wherein the portion of the laser device cleaved off is between about 50 μm and 300 μm in length.

30. The method of claim 17, wherein the laser device is an expanded beam laser.

31. The method of claim 17, wherein the laser device is an electro-modulated laser.

32. The method of claim 17, wherein the laser device is a distributed Bragg reflector laser.

* * * * *